United States Patent
Kim et al.

(10) Patent No.: US 9,455,548 B2
(45) Date of Patent: Sep. 27, 2016

(54) METHODS AND APPARATUS FOR GENERATING TERAHERTZ RADIATION

(71) Applicant: Board of Trustees of the University of Alabama, Tuscaloosa, AL (US)

(72) Inventors: Seongsin Kim, Tuscaloosa, AL (US); Patrick Kung, Tuscaloosa, AL (US)

(73) Assignee: The Board of Trustees of The University of Alabama, Tuscaloosa, AL (US)

( * ) Notice: Subject to any disclaimer, the term of this patent is extended or adjusted under 35 U.S.C. 154(b) by 0 days.

(21) Appl. No.: 14/676,213

(22) Filed: Apr. 1, 2015

(65) Prior Publication Data

US 2015/0244143 A1 Aug. 27, 2015

Related U.S. Application Data

(62) Division of application No. 13/835,243, filed on Mar. 15, 2013, now Pat. No. 9,118,163.

(60) Provisional application No. 61/622,823, filed on Apr. 11, 2012.

(51) Int. Cl.

| | | |
|---|---|---|
| *H01S 3/10* | (2006.01) | |
| *H01S 5/06* | (2006.01) | |
| *G02F 1/35* | (2006.01) | |
| *G02F 1/355* | (2006.01) | |
| *H01S 1/02* | (2006.01) | |
| *H01S 5/04* | (2006.01) | |
| *H01S 5/30* | (2006.01) | |

(52) U.S. Cl.
CPC ........... *H01S 5/0604* (2013.01); *G02F 1/3544* (2013.01); *G02F 1/3558* (2013.01); *H01S 1/02* (2013.01); *H01S 5/041* (2013.01); *H01S 5/3013* (2013.01); *G02F 2001/3548* (2013.01); *G02F 2203/13* (2013.01)

(58) Field of Classification Search
CPC ...... H01S 5/0604; H01S 1/02; H01S 5/3013; H01S 5/041; G02F 1/3544; G02F 1/3558; G02F 2203/13; G02F 2001/3548
See application file for complete search history.

(56) References Cited

U.S. PATENT DOCUMENTS

| | | | |
|---|---|---|---|
| 5,652,551 | A | 7/1997 | Wittstruck |
| 5,654,229 | A | 8/1997 | Leplingard et al. |
| 5,875,053 | A | 2/1999 | Webjorn et al. |
| 7,339,718 | B1 | 3/2008 | Vodopyanov et al. |
| 7,349,609 | B1 | 3/2008 | Vodopyanov et al. |
| 7,397,428 | B2 | 7/2008 | Cole et al. |
| 7,787,724 | B2 | 8/2010 | Creeden et al. |
| 7,919,764 | B2 | 4/2011 | Metcalfe et al. |
| 9,118,163 | B2 * | 8/2015 | Kim et al. |

(Continued)

FOREIGN PATENT DOCUMENTS

| | | |
|---|---|---|
| DE | 102008025199 | 9/2009 |

*Primary Examiner* — Yuanda Zhang
(74) *Attorney, Agent, or Firm* — Meunier Carlin & Curfman LLC

(57) ABSTRACT

Methods and apparatus for generating terahertz radiation are disclosed herein. In addition, methods for forming orientation-patterned nonlinear semiconductor crystals are disclosed herein. For example, according to an example implementation, a method for generating terahertz radiation may include: providing an optical pulse having a wavelength less than approximately 1.0 μm; and illuminating an orientation-patterned nonlinear semiconductor crystal with the optical pulse.

11 Claims, 4 Drawing Sheets

(56) References Cited

U.S. PATENT DOCUMENTS

2002/0155634 A1  10/2002  D'Evelyn et al.
2010/0006780 A1  1/2010  Metcalfe et al.
2010/0235114 A1  9/2010  Levy et al.
2010/0271618 A1  10/2010  Ito et al.

* cited by examiner

METHODS AND APPARATUS FOR GENERATING TERAHERTZ RADIATION

CROSS-REFERENCE TO RELATED APPLICATIONS

This application is a divisional application of U.S. application Ser. No. 13/835,243 filed on Mar. 15, 2013, now U.S. Pat. No. 9,118,163, issued Aug. 25, 2015, which claims the benefit of and priority to U.S. Provisional Patent Application No. 61/622,823 filed on Apr. 11, 2012, entitled "Methods and Apparatus for Generating Terahertz Radiation," both of which are expressly incorporated herein by reference in their entireties and made a part hereof.

STATEMENT REGARDING FEDERALLY FUNDED RESEARCH

This invention was made with government support under Grant No. NSF 1127831 from the National Science Foundation. The government may have certain rights in the invention.

BACKGROUND

The terahertz (THz) portion of the spectrum (i.e., frequencies greater than $10^{12}$ hertz (Hz)) represents a current frontier for multidisciplinary science and technology. Enormous potential opportunities exist in engineering, physics, material science, chemistry, biology and medicine, and particularly when using the portion of the spectrum between 0.5 and 20 THz. For example, practical applications abound in the areas of imaging, sensing and spectroscopy, such as medical imaging, industrial imaging (i.e., package inspection), homeland security, gas sensing, biological spectroscopy including bio-warfare agent detection, explosive detection and astronomy. Some of these practical applications stem from the unique ability of THz radiation to safely penetrate a wide-variety of non-conducting materials including clothing, paper, cardboard, wood, masonry, plastics, ceramics, etc.

In addition to THz time domain spectroscopy, THz generation by optical down-conversion in nonlinear optical materials has become a viable alternative way to generate THz radiation. Generating THz radiation by optical down-conversion was first demonstrated in the early 1970s, but it has become more popular recently due to the availability of reliable ultra-fast lasers. THz generation by optical down-conversion in optical parametric oscillators (OPOs) provides a good illustration of the Manley-Rowe conversion limit, where a high energy optical photon (i.e., a pump) generates a THz photon and a lower energy optical photon (i.e., an idler). However, because each pump photon can generate only one THz photon, the power conversion efficiency will be limited to less than 1% even when the photon conversion efficiency is 100% due to the lower energy of the THz photons. Therefore, the typical power conversion efficiency of THz OPOs is typically on the order of $2 \times 10^{-8}$. Additionally, the short interaction length between the generated THz radiation and the optical pulses limits the efficiency of THz generation by ultra-fast optical pulses in nonlinear crystals. For example, the interaction length (i.e., the coherence length) is limited by the velocity mismatch between the optical pulses and the generated THz radiation due to dispersion. Thus, the optical down-conversion process is most efficient in materials having longer coherence lengths such as ZnTe, where the coherence length reaches several millimeters for an 800 nm pump laser. However, distortion leads to broadening of femtosecond optical pulses in ZnTe, which reduces the peak power conversion efficiency.

Quasi-phase matching (QPM) microstructures can effectively extend the coherence length between the generated THz radiation and the optical pulses. Thus, the development of QPM crystals, in which periodically-patterned changes in the sign of the nonlinear coefficient compensate for the wave-vector mismatch, has revolutionized many aspects of nonlinear frequency conversion. For example, by replacing the dependence on naturally occurring birefringence with the lithographically-controlled (i.e., systematically-engineered) patterning, the range of operation of the rare, well-developed nonlinear material is readily extended across its transparency range. Extremely high mixing efficiencies are attained because materials with large nonlinear coefficients are accessible and noncritical operation (i.e., propagation along a symmetry direction of the crystal) is always possible. In addition, non-uniform (lateral or longitudinal) QPM gratings allow tailoring of the tuning behavior in ways impossible in birefringently-phase-matched media.

The coherence length between the generated THz radiation and the optical pulses can be extended using QPM microstructures such as periodically-polled $LiNbO_3$ (PPLN) and orientation-patterned GaAs (OP-GaAs). The QPM microstructures include the periodic system of domains of inverted crystal orientation. As a result, the phase of the nonlinear polarization generated by short optical pulses changes by 180° at the domain boundaries. If the domain length is equal to the coherence length, phase-matching conditions between the THz radiation and the nonlinear polarization will be restored at the domain boundaries, which extends the interaction length between the THz radiation and the optical pulses.

THz generation using OP-GaAs has been studied because of several unique characteristics of GaAs. Specifically, GaAs has high transparency in the THz spectral region, a high nonlinear coefficient and low dispersion in the near-infrared and THz spectral regions. For example, U.S. Pat. No. 7,339,718 to Vodopyanov et al. and U.S. Pat. No. 7,349,609 to Vodopyanov et al. disclose THz laser sources using OP-GaAs semiconductor crystal. The current state-of-the-art includes a near diffraction-limited THz laser source using an OP-GaAs semiconductor crystal with 1 mW average power output, an optical-to-optical conversion efficiency of 0.01% and a tunable frequency between 0.65 and 3.4 THz.

However, THz generation using an OP-GaAs semiconductor crystal is severely limited in practical applications due to free-carrier generation by high-intensity optical pulses due to two-photon absorption, which is very strong in the THz spectral range. Thus, the pump power and the choice of pump beam wavelength are practically limited. For example, in order to avoid two-photon absorption and limit losses in THz power output, the pump laser must emit at 2 µm (i.e., below the two-photon absorption edge of GaAs). High-power femtosecond lasers that emit at 2 µm, however, are not readily available, and instead are only available by custom order, which significantly increases the costs by up to $200 k, for example. In addition, an additional OPO system is required to obtain 2 µm laser emission.

SUMMARY

Methods and apparatus for generating terahertz radiation are disclosed herein. In addition, methods for forming orientation-patterned nonlinear semiconductor crystals are disclosed herein. For example, according to an example implementation, a method for generating terahertz radiation may include: providing an optical pulse having a wavelength less than approximately 1.0 µm; and illuminating an orientation-patterned nonlinear semiconductor crystal with the optical pulse.

In addition, at least a portion of the terahertz radiation may be produced by optical down-conversion.

In some implementations, the orientation-patterned nonlinear semiconductor crystal may include alternately-inverted crystal domains, where each crystal domain has a crystal orientation inverted with respect to adjacent crystal domains.

Alternatively or additionally, the widths of the alternately-inverted crystal domains may achieve quasi-phase-matching between the optical pulse and the terahertz radiation.

According to some implementations, the orientation-patterned nonlinear semiconductor crystal may have a hexagonal crystal symmetry. For example, the orientation-patterned nonlinear semiconductor crystal may be a wurtzite crystal. The orientation-patterned nonlinear semiconductor crystal may be one of: $Al_xGa_{1-x}N$, $In_xGa_{1-x}N$ and $Al_xIn_yGa_{1-x-y}N$. Alternatively, the orientation-patterned nonlinear semiconductor crystal may be GaN or AlN.

Optionally, the wavelength of the optical pulse may be in a range between approximately 0.4 and 1.0 µm. For example, when the orientation-patterned non-linear semiconductor is GaN, the wavelength of the optical pulse may be greater than a threshold for two-photon absorption, which is approximately 0.75 µm, for GaN. Alternatively, when the orientation-patterned non-linear semiconductor is AlN, the wavelength of the optical pulse may be greater than a threshold for two-photon absorption, which is approximately 0.4 µm, for AlN.

According to another example implementation, an apparatus for generating terahertz radiation may include: an orientation-patterned nonlinear semiconductor crystal; and an optical pulse generator configured to illuminate the orientation-patterned nonlinear semiconductor crystal with an optical pulse having a wavelength less than approximately 1.0 µm.

In addition, at least a portion of the terahertz radiation may be produced by optical down conversion.

Alternatively or additionally, the orientation-patterned nonlinear semiconductor crystal may include alternately-inverted crystal domains, each crystal domain having a crystal orientation inverted with respect to adjacent crystal domains.

In some implementations, the widths of the alternately-inverted crystal domains may achieve quasi-phase-matching between the optical pulse and the terahertz radiation.

Additionally, the orientation-patterned nonlinear semiconductor crystal may have a hexagonal crystal symmetry. For example, the orientation-patterned nonlinear semiconductor crystal may be a wurtzite crystal. The orientation-patterned nonlinear semiconductor crystal may be one of: $Al_xGa_{1-x}N$, $In_xGa_{1-x}N$ and $Al_xIn_yGa_{1-x-y}N$. Alternatively, the orientation-patterned nonlinear semiconductor crystal may be GaN or AlN.

Optionally, the wavelength of the optical pulse may be in a range between approximately 0.4 and 1.0 µm. For example, when the orientation-patterned non-linear semiconductor is GaN, the wavelength of the optical pulse may be greater than a threshold for two-photon absorption, which is approximately 0.75 µm, for GaN. Alternatively, when the orientation-patterned non-linear semiconductor is AlN, the wavelength of the optical pulse may be greater than a threshold for two-photon absorption, which is approximately 0.4 µm, for AlN.

According to another example implementation of the invention, a method of forming an orientation-patterned nonlinear semiconductor crystal such as GaN crystal may include: providing a substrate having a surface; forming an intermediate layer on the surface of the substrate; etching the intermediate layer, the etching exposing at least a portion of the surface of the substrate; and forming the nonlinear semiconductor crystal. The first domain of the nonlinear semiconductor crystal may be formed over the intermediate layer, and the second domain of the nonlinear semiconductor crystal may be formed over the exposed portion of the surface of the substrate. In addition, the first domain may have a first crystal orientation, and the second domain may have a second crystal orientation that is opposite to the first crystal orientation. Further, widths of the first and second domains may achieve quasi-phase-matching between an optical pulse having a wavelength greater than a threshold for two-photon absorption in GaN and the terahertz radiation.

Additionally, the intermediate layer may be at least one of AlN, ZrN, ZnN and AlO. The intermediate layer may be formed by at least one of sputtering, ion beam deposition, electron-beam evaporation and atomic layer deposition.

In some implementations, the widths of the first and second domains may be determined by widths of the portion of the surface of the substrate exposed by etching.

In yet another example implementation, a method of forming an orientation-patterned nonlinear semiconductor crystal such as GaN crystal may include: providing a substrate having a surface; treating a first region of the surface of the substrate, the treatment modifying a chemical structure of the surface of the substrate in the first region; and forming the nonlinear semiconductor crystal. The first domain of the nonlinear semiconductor crystal may be formed over the first region of the surface of the substrate, and the second domain of the nonlinear semiconductor crystal may be formed over a second region of the surface of the substrate that is adjacent to the first region. In addition, the first domain may have a first crystal orientation, and the second domain may have a second crystal orientation that is opposite to the first crystal orientation. Further, widths of the first and second domains may achieve quasi-phase-matching between an optical pulse having a wavelength greater than a threshold for two-photon absorption in GaN and the terahertz radiation.

Additionally, the method may include treating a first region of the surface of the substrate by exposing the first region with an ion beam. The ion beam may modify a chemical structure of the substrate in the first region.

In some implementations, the widths of the first and second domains may be determined by widths of the first and second regions.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. While implementations will be described for generating THz radiation using an orientation-patterned nonlinear semiconductor crystal, it will become evident to those skilled in the art that the implementations are not limited thereto.

Figure 1:
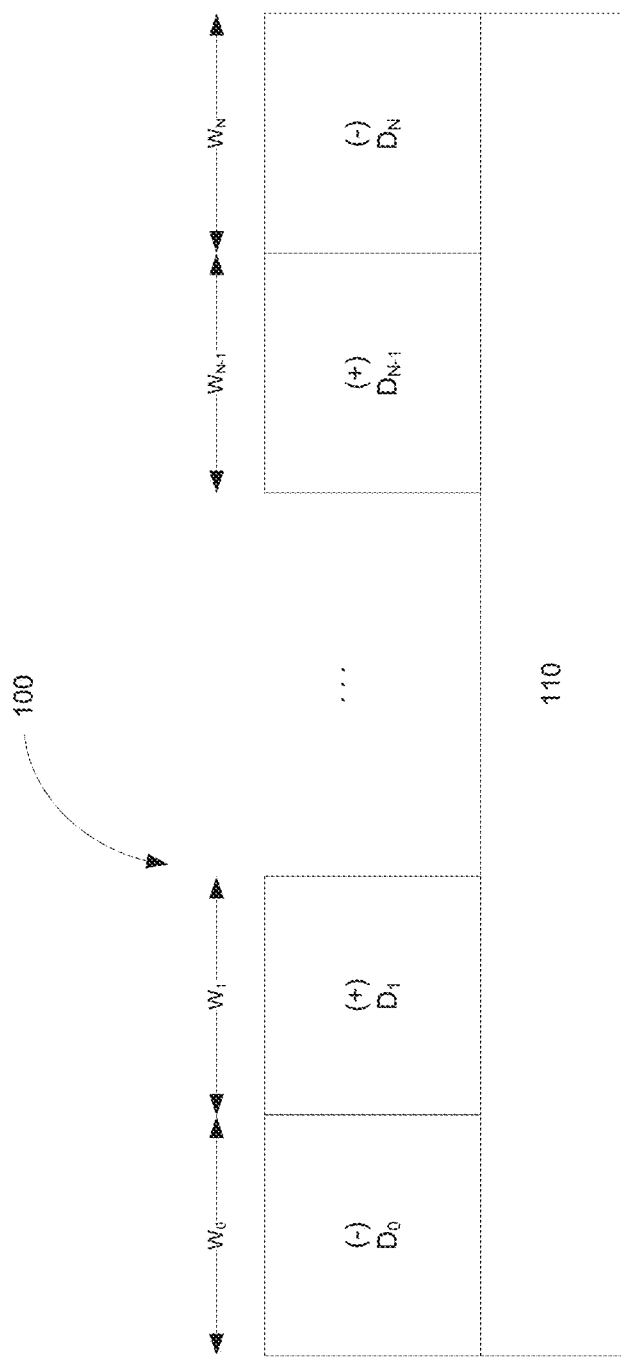
FIG. 1 is a block diagram illustrating an orientation-patterned nonlinear crystal according to an implementation of the invention.

Referring to FIG. 1, an orientation-patterned (OP) nonlinear semiconductor crystal 100 according to an implementation of the invention is shown. The OP nonlinear semiconductor crystal 100 may include a linear array of alternately-inverted crystal domains $D_0, D_1 \ldots D_{N-1}, D_N$, where each crystal domain has a crystal orientation inverted with respect to adjacent domains. The alternately-inverted crystal domains $D_0, D_1 \ldots D_{N-1}, D_N$ may compensate for the wave-vector mismatch between the optical pulses and the THz radiation. The optical path length through the alternately-inverted domains $D_0, D_1 \ldots D_{N-1}, D_N$ at least in part determines the frequency of the generated THz radiation. The widths $W_0, W_1 \ldots W_{N-1}, W_N$ of the domains $D_0, D_1 \ldots D_{N-1}, D_N$ may be variable to achieve quasi-phase-matching (QPM) between the optical pulses and the THz radiation, for example. In addition to varying domain widths, periodicity and the number of periods may vary based on the characteristics of the excitation laser and/or desired characteristics of the generated THz radiation.

The nonlinear semiconductor crystal may be a GaN or a GaN-based crystal such as, $Al_xGa_{1-x}N$, $In_xGa_{1-x}N$ and $Al_x-In_yGa_{1-x-y}N$. Using GaN crystals to generate THz radiation provides advantages over state-of-the-art PPLN and GaAs crystals. For example, GaN crystals are wurtzite crystals that have a hexagonal symmetry and optical nonlinear characteristics. Thus, GaN crystals are different than conventional semiconductors (i.e., Si, GaAs, etc.), which have a diamond or zinc-blende crystal structure with a cubic symmetry. GaN crystals have a hexagonal symmetry, and as such, the atomic planes are alternately (0001) layers of Ga and (0001) layers of N. Thus, one of the faces will be (0001)Ga and the other face will be (0001)N because the GaN crystal has equal numbers of Ga and N atoms. The (0001) surface or polarity is generally referred to as the (0001)Ga, and the (000-1) surface or polarity is generally referred to as the (0001)N. Due to the wurtzite crystal structure, GaN crystals have a natural ability to grow in the (0001) and (000-1) directions. Thus, GaN crystal can be grown to achieve OP structures, as compared to GaAs crystals, which require alternating (111) and (−1−1−1) orientations. As discussed herein, the atom (i.e., Ga or N) is used to distinguish polarities, and the (000-1) surface will not be used.

GaN also has a large bandgap energy of ~3.4 eV at wavelength ~365 nm, as compared to the bandgap of GaAs at a wavelength of ~870 nm. Thus, GaN is relatively transparent to lasers with wavelengths longer than 365 nm (i.e., a transparency range between ~0.365 and 14 µm), while GaAs is relatively transparent to lasers with wavelengths longer than 870 nm (i.e., a transparency range between 0.9 and 13 µm). In addition, it is possible to avoid the two-photon absorption threshold and excite GaN with an ultra-fast laser having a wavelength longer than ~750 nm. As discussed above, in order to avoid the two-photon absorption threshold when using GaAs, the ultra-fast laser is required to emit at a wavelength longer than 1800 nm. Further, by alloying GaN with AlN and/or InN, it may be possible to achieve a bandgap energy anywhere between ~6.2 eV at a wavelength of ~200 nm and ~0.7 eV at a wavelength of ~1780 nm. In addition, it is possible to avoid the two-photon absorption threshold and excite AlN with an ultra-fast laser having a wavelength longer than ~400 nm. Thus, there are more suitable and compact lasers with high power output for exciting GaN available as compared to the lasers required to excite GaAs. Optionally, more conventional high power, multi-watt, ultra-fast lasers (i.e., emitting in the 0.7-1.0 µm range) can be used to excite the GaN-based structures without generating free carriers.

As shown in Eqn. (1), below, the output power of the THz radiation is generally dependent on the nonlinear coefficient of the crystal, the length of the crystal and the wavelength of the laser. In particular, the wavelength of the laser has a very large impact on the THz output power. Thus, because GaN may be excited (or pumped) with an ultra-fast laser having a wavelength of approximately 0.78 µm (compared to 2.0 µm for GaAs), the output power may be increased by approximately 17 times. It should also be understood that the output power may be increased even more by using semiconductor materials that may be excited (or pumped) with an ultra-fast laser having smaller wavelengths such as AlN, which may be excited by an ultra-fast laser having wavelength approximately greater than 0.4 µm, for example.

$$P_{out,\omega} \propto \frac{L \times d_{eff}^2}{\varepsilon_0 \times c \times n^2 \times \lambda^3} \times P_\omega \qquad (1)$$

where L is the crystal length, $d_{eff}$ is the nonlinear coefficient, $\varepsilon_0$ is the dielectric constant, c is the speed of light, n is the refractive index, $\lambda$ is the pump wavelength, $P_{out,\omega}$ is the output power and $P_\omega$ is the input power.

Additionally, the thermal conductivity of GaN is approximately 2.5 times greater than the thermal conductivity of GaAs. Specifically, GaN has a higher thermal conductivity $$\left(1.3 \frac{W}{K \times cm}\right)$$

than GaAs $$\left(0.55 \frac{W}{K \times cm}\right).$$

Further, as discussed above, by alloying GaN with AlN, the thermal conductivity can be increased because AlN has a thermal conductivity of $$2.85 \frac{W}{K \times cm}.$$

Thus, GaN is capable of dissipating the heat generated by the incident laser beam better than GaAs, which can optionally afford a higher damage threshold and allow higher excitation powers. In addition, due to its larger bandgap, GaN is physically stronger than GaAs. Specifically, the melting point of GaN is 2,500° C., and the melting point of GaAs is 1,240° C. Optionally, the melting point can be increased by alloying GaN with AlN, which has a melting point of 2,750° C. Therefore, GaN is capable of sustaining stronger laser beams and heat stress without damage. GaN is also less toxic than GaAs because it does not contain arsenic.

Most of the linear and nonlinear optical properties of GaN closely resemble the linear and nonlinear properties of PPLN. However, GaN has higher nonlinear coefficients (maximum $d_{eff}$=33 pm/v) than PPLN and does not suffer from photorefractive effects.

While the implementations discussed herein include a nonlinear semiconductor crystal made of GaN or GaN-based crystals, other semiconductor materials may be suitable for construction of the nonlinear semiconductor crystal. Specifically, other semiconductor materials that exhibit properties similar to those discussed above may be particularly suitable. For example, any III-V nitride wurtzite semiconductor, where N is the group V element and Ga, Al and/or In is the group III element may be suitable materials. These examples include $Al_xGa_{1-x}N$, $In_xGa_{1-x}N$ and $Al_xIn_yGa_{1-x-y}N$, where different proportions are indicated by indices x and y, which can be any fractional number between 0 and 1, inclusive and including 0 and 1. In addition, the following wurtzite semiconductors have a large bandgap energy and are also suitable materials: ZnO (3.2 eV) and alloys with $Zn_{1-x}Mg_xO$, $Zn_{1-x}Cd_xO$. Optionally, by changing the composition of the semiconductor crystal, physical properties such as bandgap energy, lattice constants, etc., can be tailored, which allows flexibility in the design of the OP-QPM structures.

Doping may also be used to control the amount and type of charge carriers in the crystal (electrons and/or holes). Controlling the amount of carriers may be necessary in order to enhance the propagation of the generated THz wave through the crystal because a high concentration of charges can potentially screen the THz wave or absorb part of it (through a mechanism called free carrier absorption of an electromagnetic wave).

Figure 2:
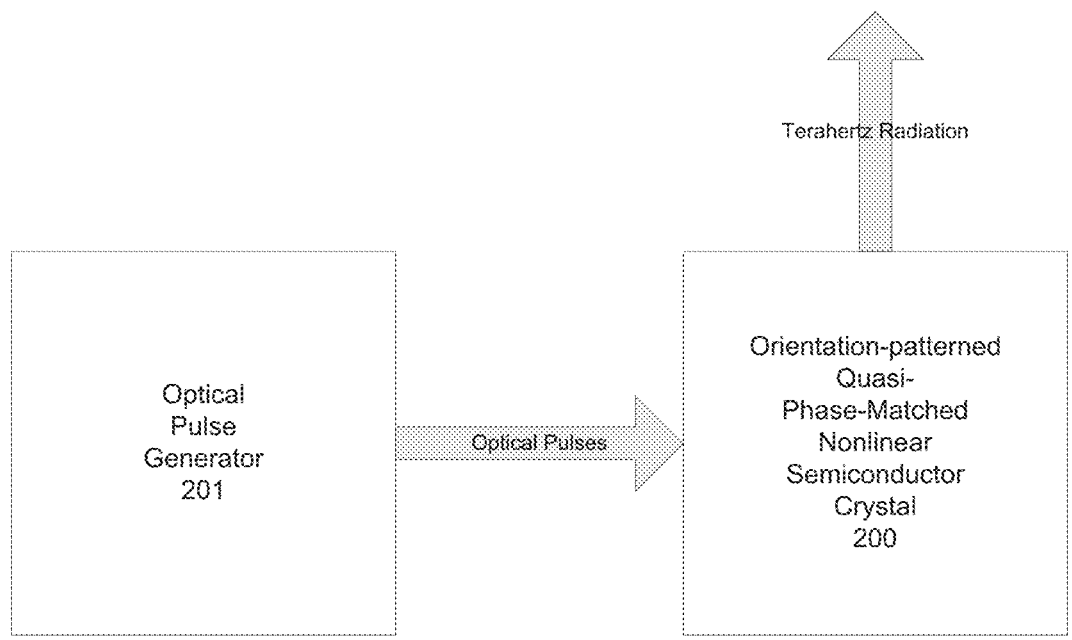
FIG. 2 is a block diagram illustrating an apparatus for generating THz radiation according to an implementation of the invention.

Referring now to FIG. 2, a block diagram illustrating an apparatus for generating THz radiation is shown. The apparatus may include an optical pulse generator 201 and an OP-QPM nonlinear semiconductor crystal 200 such as GaN crystal, for example. As discussed above, the THz radiation may be generated by optical down-conversion as optical pulses propagate through the OP-QPM nonlinear semiconductor crystal 200. In particular, the optical pulse generator 201 illuminates the OP-QPM nonlinear semiconductor crystal 200 such that the optical pulses propagate substantially perpendicular relative to the domain boundaries of the OP-QPM nonlinear semiconductor crystal 200. In addition, THz generation efficiency may be enhanced by placing the OP-QPM nonlinear semiconductor crystal 200 within an external resonance cavity to which the optical pulse generator 201 is optically coupled, by placing the OP-QPM nonlinear semiconductor crystal 200 within a laser cavity that produces the optical pulses or by placing the OP-QPM nonlinear semiconductor crystal 200 in an OPO cavity that produces the optical pulses. Widths of the alternately-inverted crystal domains, periodicity and number of periods may vary based on the characteristics of the optical pulses and/or desired characteristics of the generated THz radiation. For example, the periodicity of the alternately-inverted domains may be chosen based on the phase mismatch between the optical pulses and the THz radiation. In particular, the periodicity may be chosen to yield THz radiation at a predetermined wavelength for which the THz and optical pulse wavelengths accumulate a 180° phase difference while propagating through the domains. Accordingly, the optical pulses and the THz radiation are periodically re-phased, which enables optical down-conversion over longer lengths of crystal. The periodic, alternately-oriented domains, therefore, may be varied to achieve the desired frequency of the generated THz radiation, which may include multiple desired frequencies.

As discussed above, more conventional high power, multi-watt, ultra-fast lasers can be used to excite GaN-based crystals without generating free carriers. For example, when using an OP-QPM GaN crystal or an OP-QPM AlN crystal, the optical pulse generator 201 may emit optical pulses having wavelengths approximately greater than 750 nm and 400 nm, respectively, in order to avoid the two-photon absorption threshold. Thus, the optical pulse generator 201 may be a Ti:Sapphire femtosecond laser with a variable emission wavelength between 800 and 900 nm. Alternatively, the optical pulse generator 201 may be a compact femtosecond frequency-doubler fiber laser emitting at 780 nm. These example optical pulse generators are less expensive, more compact and more readily available than optical pulse generators capable of generating optical pulses having a wavelength greater than 2.0 μm (i.e., exceeding the two-photon absorption threshold of GaAs).

Methods for Forming OP-QPM Semiconductor Crystals

There are many methods available for forming OP-QPM nonlinear semiconductor crystals. For example, it may be possible to form an OP-QPM semiconductor crystal, such as an OP-QPM GaN crystal, for example, by stacking bulk crystals of appropriate size in such a way that they are alternately-oriented (0001) and (000-1). To form an OP-QPM GaN crystal, therefore, bulk crystals oriented with (0001)Ga surface or polarity are alternately stacked with bulk crystals oriented with (0001)N surface or polarity. In addition, it may be desirable to ensure that the interfaces between the alternately-oriented crystals are clean of impurities and atomically flat. Further, it may be desirable to ensure that the alternately-oriented crystals are perfectly aligned (i.e., the crystal axes are parallel).

In addition to forming OP-QPM nonlinear semiconductor crystals by staking bulk crystals, it is also possible to form OP-QPM nonlinear semiconductor crystals using thin film or epitaxial growth techniques or bulk growth techniques. Generally, thin film and bulk growth techniques involve generating nonlinear semiconductor crystals by bringing atomic elements in gas form and layering them atomic layer-by-atomic layer. For example, it is possible to "grow" OP-QPM nonlinear semiconductor thin films having widths up to 1 mm, such as OP-QPM GaN thin films, for example. Thin film or epitaxial growth techniques include, but are not limited to, metalorganic chemical vapor deposition (MOCVD) or metalorganic vapor phase epitaxy (MOVPE), hydride vapor phase epitaxy (HVPE), molecular beam epitaxy (MBE), pulsed laser deposition (PLD), sputtering or ion beam deposition, and liquid phase epitaxy. It may also be possible to form OP-QPM nonlinear semiconductor crystals using bulk growth techniques, which yield films having thicknesses greater than 1 mm. However, bulk growth techniques require the use of high pressures and temperatures, and therefore, may tend to be more difficult than thin film or epitaxial growth techniques. Thin film growth techniques such as MOCVD/MOVPE, MBE, HVPE and bulk growth techniques may be desirable in order to achieve the best crystallinity.

The object of the methods is to achieve an OP structure, i.e., a linear array of alternately-inverted crystal domains. For example, when forming an GaN crystal, the object is to achieve a linear array of domains that are alternately-oriented (0001)Ga polar and (000$\bar{1}$)N polar. In particular, the GaN crystal may be oriented with the (0001)Ga polarity in a first domain and the (000$\bar{1}$)N polarity in adjacent domains. Generally, the alternately-inverted crystal domains may be achieved by controlling the initial stages of the growth of the GaN, which may be achieved by presenting an appropriate chemical surface for the GaN to be grown and bonded on. In addition, the sizes of the alternately-inverted domains may be selected to achieve QPM condition based on the excitation laser utilized when generating THz radiation. Although the methods for forming OP-QPM nonlinear semiconductor crystals discussed below describe OP-QPM GaN crystals, it should be understood that the methods may be used to form other OP-QPM nonlinear semiconductor crystals, which are discussed above.

Figure 3C:
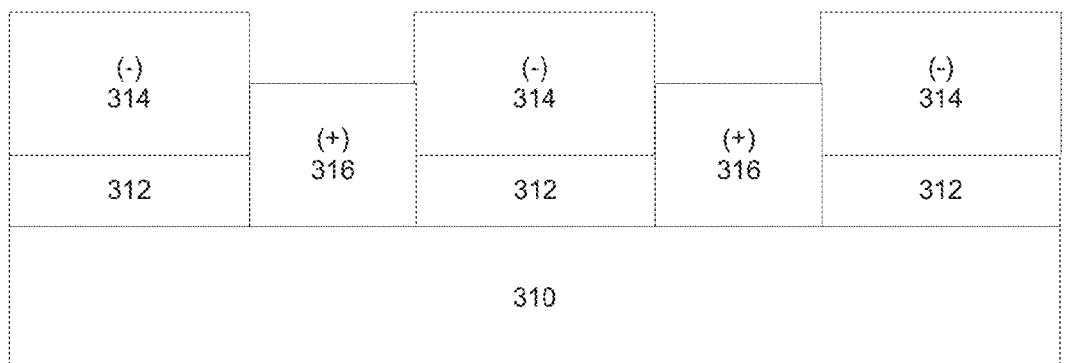
FIGS. 3A-3C illustrate a method for forming an orientation-patterned nonlinear GaN crystal according to an implementation of the invention.
Figure 3B:
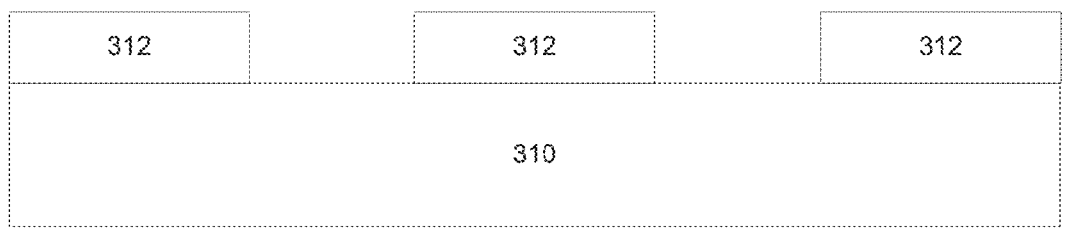
Figure 3A:
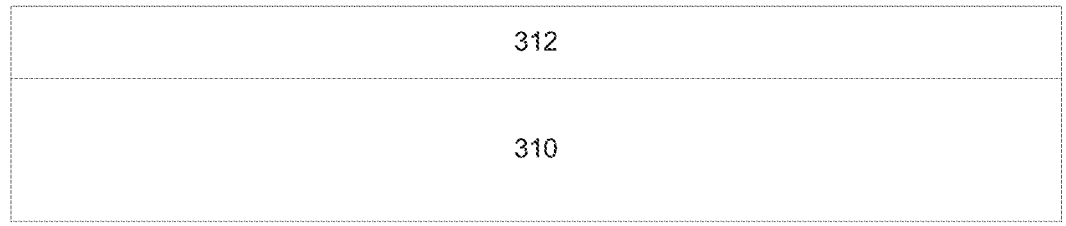

FIGS. 3A-3C illustrate a method for forming an orientation-patterned nonlinear semiconductor according to an implementation of the invention. The illustrated method depicts formation of an OP-QPM GaN crystal but may be utilized to form other OP-QPM nonlinear semiconductor crystals. Referring now to FIG. 3A, the GaN crystal may be formed on a substrate 310, i.e., a flat support wafer. The substrate 310 may have a crystal symmetry (or an in-plane symmetry) similar to that of the desired crystal (or its in-plane symmetry). Additionally, the substrate 310 may have any size. In some implementations, the GaN crystal may be grown on a sapphire substrate, which has a trigonal symmetry that is close to the hexagonal symmetry of GaN crystal. However, it should be understood that other substrates, such as silicon carbide, silicon, diamond, quartz, bulk GaN-based substrates, etc., may be used. The growth may be carried out on the (0001) surface of sapphire (i.e., the basal plane of sapphire), the (0001) surface of silicon carbide, the (111) surface of silicon, the (111) surface of diamond, etc. As an alternative to GaN-based substrates, GaN-based templates may be used. GaN-based templates are films of crystalline GaN that are thick enough to act as a substrate on which to carry out the growth process.

When substrates or templates that are chemically and structurally different than the GaN crystal are used, an intermediate layer 312 may be needed in order to make the transition between the substrate 310 and the GaN crystal. The material used for the intermediate layer 312 is not particularly limited and may include, but is not limited to, GaN, AlN, ZrN, ZnN, AlO, and combinations thereof, such as $Al_xGa_{1-x}N$, $In_xGa_{1-x}N$, $Al_xIn_yGa_{1-x-y}N$, $AlO_x$, $Zn_xN_y$, etc. The compounds used for the intermediate layer 312 may have a different stoichiometry than the substrate 310, and may therefore promote formation of GaN crystal having an orientation opposite to the GaN crystal formed directly on the substrate 310. In addition, the intermediate layer 312 does not necessarily have to be crystalline, and the intermediate layer 312 may therefore be deposited using the same growth techniques that are used for forming the GaN crystal, or using other thin film deposition techniques such as sputtering, ion beam deposition, electron-beam evaporation, atomic-layer deposition, etc.

As shown in FIG. 3B, after forming the intermediate layer 312, a pattern may be formed by removing portions of the intermediate layer 312. The pattern may be formed to achieve a suitable OP-QPM template. Widths of the alternately-inverted crystal domains, periodicity and number of periods may vary based on the characteristics of the excitation laser and/or desired characteristics of the generated THz radiation. For example, the periodicity of the alternately-inverted domains may be chosen based on the phase mismatch between the optical pulses and the THz radiation. In particular, the periodicity may be chosen to yield THz radiation at a predetermined wavelength for which the THz and optical pulse wavelengths accumulate a 180° phase difference while propagating through the domains. Accordingly, the optical pulses and the THz radiation are periodically re-phased, which enables optical down-conversion over longer lengths of crystal. Thus, the pattern may define the desired crystal domain widths, periodicity and/or number of periods. Portions of the intermediate layer 312 may be removed by photolithography, wet etching (i.e., using KOH or other etchants) and/or ion milling (i.e., reactive ion etching, inductively coupled plasma etching, or any other dry etching method).

As shown in FIG. 3C, after forming the pattern in the intermediate layer 312, the GaN crystal may be formed. Optionally, a nitridation step may be performed by flowing a precursor (e.g., $NH_3$) at high temperature to transform the topmost layer of atoms on the surface of the substrate 310 into an array of atoms that promote the stacking of Ga and N atoms in a specific orderly manner. It should be understood that the precursor is not limited to $NH_3$, and that other precursors may be utilized. The temperature, pressure, duration, flow rate of the precursor, flow rate of the carrier gas (i.e., nitrogen, hydrogen, argon, helium, or any mixture thereof) during the nitridation step are the means of controlling formation of the GaN crystal following the nitridation step.

As discussed above, the optical orientation of the GaN crystal domains may be alternately-inverted to achieve QPM between the optical pulses and the THz radiation. The (0001)Ga or (000$\bar{1}$)N polarity of the GaN crystal, therefore, may be controlled through the pattern of the intermediate layer 312 and/or the nitridation step. In particular, GaN crystal having a first orientation 314 may be formed over portions of the substrate 310 layered with the intermediate layer 312, and the GaN crystal having a second orientation 316, which is opposite to the first orientation, may be formed over portions of the substrate not layered with the intermediate layer 312. For example, the GaN crystal having the first orientation 314 may be (000$\bar{1}$)N polar, and the GaN crystal having the second orientation 316 may be (0001)Ga polar. After forming the OP-QPM template (and optionally performing the nitridation step), the GaN crystals may be formed by MOCVD/MOVPE, HVPE, or any other thin film growth technique. It may be possible to achieve an OP-QPM GaN crystal layer having the desired thickness (i.e., greater than 5 mm) and length (i.e., greater than 2 cm) with optimal optical qualities. Using the above method, it may be possible to form the OP-QPM GaN crystal having alternately-inverted crystal domains in only two epitaxy or growth steps.

Figure 4C:
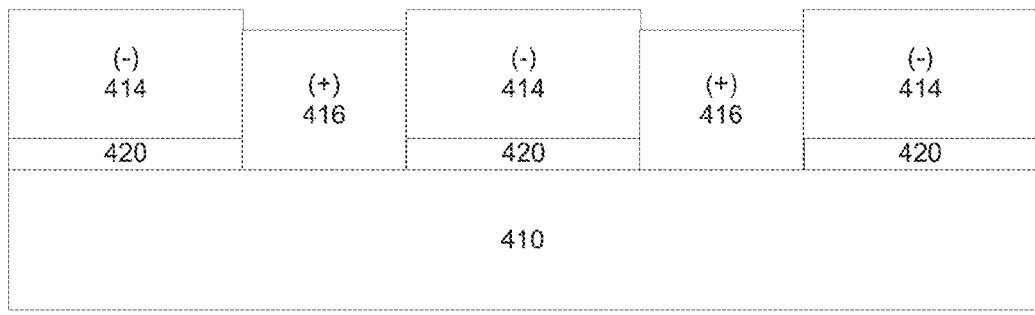
FIGS. 4A-4C illustrate a method for forming an orientation-patterned nonlinear GaN crystal according to another implementation of the invention.
Figure 4B:
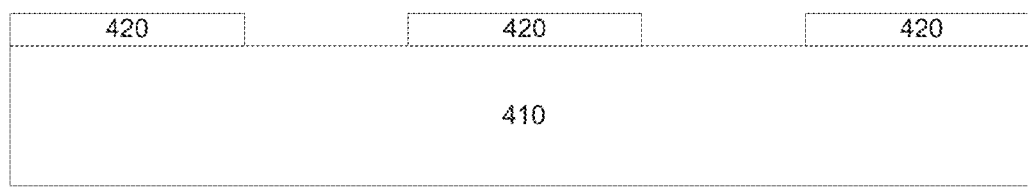
Figure 4A:
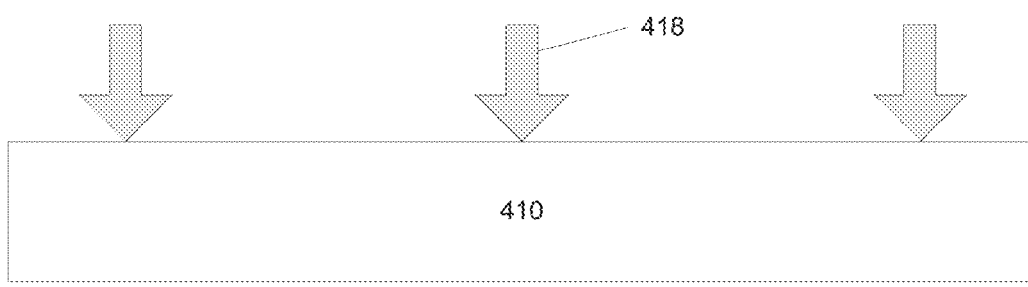

FIGS. 4A-4C illustrate a method for forming an orientation-patterned nonlinear semiconductor according to another implementation of the invention. The illustrated method depicts formation of an OP-QPM GaN crystal but may be utilized to form other OP-QPM nonlinear semiconductor crystals. As shown in FIG. 4A, a surface of the substrate 410 may be prepared using focused ion beam etching 418 at designated locations. A pattern may be formed by the surface treatment to achieve a suitable OP-QPM template. Widths of the alternately-inverted crystal domains, periodicity and number of periods may vary based on the characteristics of the excitation laser and/or desired characteristics of the generated THz radiation. For example, the periodicity of the alternately-inverted domains may be chosen based on the phase mismatch between the optical pulses and the THz radiation. In particular, the periodicity may be chosen to yield THz radiation at a predetermined wavelength for which the THz and optical pulse wavelengths accumulate a 180° phase difference while propagating through the domains. Accordingly, the optical pulses and the THz radiation are periodically re-phased, which enables optical down-conversion over longer lengths of crystal. Thus, the pattern may define the desired crystal domain widths, periodicity and/or number of periods. As shown in FIG. 4B, the surface treatment may modify the surface of the substrate 410, and especially the surface atoms, in such a way that, upon formation of GaN crystal, different polarities may be formed in regions that were exposed by the ion beam 420 and regions that were not exposed by the ion beam.

As shown in FIG. 4C, the (0001)Ga or (0001)N polarity of the GaN crystal, therefore, may be controlled through the pattern formed by the surface treatment and/or the nitridation step. In particular, GaN crystal having a first orientation 414 may be formed in regions that were exposed by the ion beam 420, and the GaN crystal having a second orientation 416, which is opposite to the first orientation, may be formed in regions that were not exposed by the ion beam. For example, the GaN crystal having the first orientation 414 may be (0001)N polar, and the GaN crystal having the second orientation 416 may be (0001)Ga polar. After forming the OP-QPM template (and optionally performing the nitridation step), the GaN crystals may be formed by MOCVD/MOVPE, HVPE, or any other thin film growth technique. It may be possible to achieve an OP-QPM layer having the desired thickness (i.e., greater than 5 mm) and length (i.e., greater than 2 cm). Using the above method, it may be possible to form GaN crystal having alternately-inverted crystal domains in only one epitaxy or growth step.

EXAMPLES

One of the most attractive uses of THz radiation, and the use with the highest potential to benefit society, is medical imaging, especially for cancer diagnostics. Unlike x-rays, THz radiation is non-ionizing and does not suffer significant Raleigh scattering, which scales as the fourth power of the frequency. Unlike ultrasound, THz imaging does not require contact with the skin. Thus, there may be an opportunity to replace the dangerous nature of x-rays as a medical imaging agent with THz radiation. In addition, the unique rotational, vibrational and translational responses of materials in the THz range provide fingerprint information that is generally absent in optical, x-ray and nuclear magnetic resonance images. This conformational information is closely related to biological functions of the molecules in tissues and cells and is difficult to access with other techniques. Further, the contrast of THz imaging techniques can be significantly enhanced due to its low scattering in comparison with conventional optical transillumination techniques. For example, THz lasers are energetic enough to resolve features five times smaller than magnetic resonance imaging and fifty times smaller than mammography. This may be crucial for cancer patients because tumors may possibly be diagnosed at an earlier stage and thereby enable a more effective treatment and higher cure rate.

Another attractive use of THz radiation may be in the field of biophotonics. Biophotonics is an advanced imaging field using manipulation of photons to observe cells and cellular activity. Biophotonics has been an established field for a long time with surveillance and industrial applications. However, it's application to the medical sciences has provided a new area of experimentation that has resulted in rapid growth. Biophotonics may expand biomedical knowledge by making analyses more sensitive, faster and easier to conduct. The early impact of biophotonics may be most evident in research applications with clinical and diagnostic applications emerging as the field continues to advance. For example, new technologies and applications of biophotonics continue to replace and augment current technologies. These applications provide safe, non-invasive, rapid feedback important to areas such as research, in vitro diagnostics, imaging and therapeutics. Photonic devices are commonly used in research laboratories, hospitals, clinics, airports, etc. THz radiation provides a source for photon manipulation. Accordingly, the THz sources discussed herein may provide an affordable, powerful and user-friendly source to make biophotonic devices more widely available.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. An orientation-patterned nonlinear semiconductor crystal for generating terahertz radiation by illumination with an optical pulse having a wavelength less than approximately 1.0 μm, comprising:

a plurality of alternately-inverted crystal domains arranged in a contiguous linear array, each crystal domain having a crystal orientation inverted with respect to adjacent crystal domains, wherein widths of the alternately-inverted crystal domains vary as a function of the wavelength of the optical pulse, wherein the widths of the alternately-inverted crystal domains achieve quasi-phase-matching between the optical pulse and the terahertz radiation when the optical pulse has a wavelength greater than a threshold for two-photon absorption in a material that comprises the orientation patterned nonlinear semiconductor crystal; and a substrate comprising a surface having at least a first region and a second region, wherein the first region of the surface of the substrate is treated to modify a chemical structure of the surface of the substrate in the first region while the second region of the surface of the substrate remains untreated, and wherein a first domain of the nonlinear semiconductor crystal is formed over the first region of the surface of the substrate and a second domain of the nonlinear semiconductor crystal is formed over the second untreated region of the surface of the substrate, wherein the first domain has a first crystal orientation and the second domain has a second crystal orientation that is opposite to the first crystal orientation.

2. The orientation-patterned nonlinear semiconductor crystal of claim 1, wherein the orientation-patterned nonlinear semiconductor crystal is formed by an epitaxial growth process.

3. The orientation-patterned nonlinear semiconductor crystal of claim 2, wherein the orientation-patterned nonlinear semiconductor crystal is formed by metalorganic vapor phase epitaxy or metalorganic chemical vapor deposition.

4. The orientation-patterned nonlinear semiconductor crystal of claim 3, wherein the orientation-patterned nonlinear semiconductor crystal is formed by hybrid vapor phase epitaxy.

5. The orientation-patterned nonlinear semiconductor crystal of claim 1, wherein the substrate further comprises an intermediate layer formed over the first region of the surface of the substrate, wherein
the first domain of the nonlinear semiconductor crystal is formed over the intermediate layer and the second domain of the nonlinear semiconductor crystal is formed over the second region of the surface of the substrate.

6. The orientation-patterned nonlinear semiconductor crystal of claim 5, wherein the intermediate layer is at least one of GaN, AlN, ZrN, ZnN, AlO, AlxGal-xN, InxGal-xN, AlxInyGal-x-yN, AlOx, and ZnxNy, where x and y are any fractional number between 0 and 1.

7. The orientation-patterned nonlinear semiconductor crystal of claim 5, wherein the intermediate layer is formed by at least one of sputtering, ion beam deposition, electron-beam evaporation and atomic layer deposition.

8. The orientation-patterned nonlinear semiconductor crystal of claim 5, wherein the widths of the first and second domains are determined by widths of the regions of the surface of the substrate exposed by etching.

9. A method of forming an orientation-patterned nonlinear GaN crystal, comprising:
providing a substrate having a surface;
treating a first region of the surface of the substrate, wherein the treatment modifies a chemical structure of the surface of the substrate in the first region, while leaving a second region of the surface of the substrate untreated; and
forming the nonlinear GaN crystal, a first domain of the nonlinear GaN crystal being formed over the first treated region of the surface of the substrate and a second domain of the nonlinear GaN crystal being formed over a second untreated region of the surface of the substrate that is adjacent to the first region, wherein the first domain has a first crystal orientation and the second domain has a second crystal orientation that is opposite to the first crystal orientation, and widths of the first and second domains achieve quasi-phase-matching between an optical pulse having a wavelength greater than a threshold for two-photon absorption in GaN and the terahertz radiation.

10. The method of claim 9, wherein treating a first region of the surface of the substrate further comprises exposing the first region with an ion beam, wherein the ion beam modifies a chemical structure of the substrate in the first region.

11. The method of claim 9, wherein the widths of the first and second domains are determined by widths of the first and second regions.

* * * * *

UNITED STATES PATENT AND TRADEMARK OFFICE
CERTIFICATE OF CORRECTION

PATENT NO. : 9,455,548 B2
APPLICATION NO. : 14/676213
DATED : September 27, 2016
INVENTOR(S) : Seongsin Kim et al.

Page 1 of 1

It is certified that error appears in the above-identified patent and that said Letters Patent is hereby corrected as shown below:

In the Specification

Column 1, Lines 19-22, the statement, which reads "This invention was made with government support under Grant No. NSF 1127831 from the National Science Foundation. The government may have certain rights in the invention."

should read --This invention was made with government support under Grant No. NSF 1127831 from the National Science Foundation. The government has certain rights in the invention.--

Signed and Sealed this
Twenty-seventh Day of December, 2016

Michelle K. Lee
*Director of the United States Patent and Trademark Office*